United States Patent [19]
Yoshida et al.

[11] Patent Number: 5,467,028
[45] Date of Patent: Nov. 14, 1995

[54] SEMICONDUCTOR INTEGRATED CIRCUIT WITH PLURAL USE OF A TERMINAL

[75] Inventors: Hironari Yoshida; Yuji Hino, both of Itami, Japan

[73] Assignee: Mitsubishi Denki Kabushiki Kaisha, Tokyo, Japan

[21] Appl. No.: 337,423

[22] Filed: Nov. 8, 1994

[30] Foreign Application Priority Data

Nov. 10, 1993 [JP] Japan .................................. 5-281069

[51] Int. Cl.⁶ .............................................. H03K 19/173
[52] U.S. Cl. ............................................ 326/38; 331/173
[58] Field of Search .............................. 327/291, 293, 327/298, 299; 326/38, 47; 331/173

[56] References Cited

U.S. PATENT DOCUMENTS

| | | | |
|---|---|---|---|
| 4,864,255 | 9/1989 | Yoshida | 331/173 |
| 4,904,962 | 2/1990 | Greene | 331/173 |
| 4,994,765 | 2/1991 | Greene | 331/173 |
| 5,051,622 | 9/1991 | Pleva | 326/38 |
| 5,237,218 | 8/1993 | Joshephson | 326/38 |
| 5,247,266 | 9/1993 | Ogata | 331/173 |

*Primary Examiner*—Edward P. Westin
*Assistant Examiner*—Andrew Sanders
*Attorney, Agent, or Firm*—Lowe, Price, LeBlanc & Becker

[57] ABSTRACT

A semiconductor integrated circuit includes an oscillator circuit, which amplifies a signal sent from an oscillator by an amplifier circuit operating with a low power supply voltage for outputting the same. In the oscillator circuit, a threshold voltage of a transfer gate forming a switching element is set to a value lower than a threshold voltage of other transistors so as to reduce an on-resistance of the transfer gate and hence to ensure output of a signal supplied from said oscillator.

3 Claims, 5 Drawing Sheets

SEMICONDUCTOR INTEGRATED CIRCUIT WITH PLURAL USE OF A TERMINAL

BACKGROUND OF THE INVENTION

1. Field of the Invention

The present invention relates to a semiconductor integrated circuit, and in particular to a semiconductor integrated circuit in which a terminal to be connected to an oscillator is used also as input/output terminal for signals.

2. Description of Related Art

FIG. 1 is a circuit diagram showing a structure of such a semiconductor integrated circuit in the prior art. A chip A containing a semiconductor integrated circuit is provided with external terminals 1 and 2. The chip A contains an NAND circuit 5, i.e., an inverting and amplifying circuit which is formed of a CMOS transistor using as its power supply an output of an unillustrated voltage reducing regulator reducing a voltage. The external terminal 1 is connected to an input terminal at one side of the NAND circuit 5, of which output terminal is connected to the external terminal 2 and an unillustrated circuit to which a clock is to be supplied.

The NAND circuit 5 receives on its input terminal at the other side a state-switching control signal 9 for switching the state of an oscillator circuit, which will be described later, between an active state and an inactive state. A damping resistance 6 and an oscillator 8 are connected in parallel between external terminals 1 and 2. The external terminals 1 and 2 are grounded via respective load capacitances 7. In this manner, a low power consumption oscillator circuit is formed of the NAND circuit 5, damping resistance 6, load capacitances 7 and oscillator 8.

Then, operation of the semiconductor integrated circuit will be described below. When the state-switching control signal 9 is set to the H-level, the NAND circuit 5 operates as an inverting amplifier, and the oscillator 8 oscillates owing to the damping resistance 6 and the load capacitance 7.

When the state-switching control signal 9 is set to the L-level, the output of NAND circuit 5 attains the H-level regardless of the input, from the external terminal 1, and the oscillator 8 does not oscillate any longer. In this manner, the external terminals 1 and 2 function as terminals for connecting the oscillator 8.

The semiconductor integrated circuit described above may be provided with terminals for connecting another oscillator circuit having a different oscillation frequency. FIG. 2 is a circuit diagram showing a structure of such a semiconductor integrated circuit. The chip A containing the semiconductor integrated circuit is provided with external terminals 31 and 32 for an oscillator circuit having an oscillation frequency of A(Hz) and external terminals 33 and 34 for an oscillator circuit having an oscillation frequency of B(Hz), and contains an inverting amplifier, i.e., NAND circuit 35, an NAND circuit 36 and a system clock select switch 38.

The external terminal 31 is connected to an input terminal at one side of the NAND circuit 35, and the NAND circuit 35 receives on its input terminal at the other side an oscillation control signal 37 from an oscillator circuit of an oscillation frequency of A(Hz). An output terminal 91 of the NAND circuit 35 is connected to the external terminal 32 and the one terminal 38a of a system clock select switch 38. The external terminal 33 is connected to an input terminal at one side of the NAND circuit 36, and the NAND circuit 36 receives on its input terminal at the other side an oscillation control signal 39 from an oscillator circuit of an oscillation frequency of B(Hz). An output terminal of the NAND circuit 36 is connected to the external terminal 34 and the other terminal 38b of the system clock select switch 38.

A switching terminal 38c of the system clock select switch 38 is connected to an unillustrated circuit to which a clock 40 is to be applied. A damping resistance 41 and an oscillator 42 of an oscillation frequency A(Hz) are interposed in parallel between external terminals 31 and 32, each of which is grounded via a load capacitance 43. A damping resistance 44 and an oscillator 45 of an oscillation frequency B(Hz) are interposed in parallel between external terminals 33 and 34, each of which is grounded via a load capacitance 46.

According to the semiconductor integrated circuit thus constructed, while the oscillator (e.g., oscillator 45) is oscillating, the other oscillator 42 can stop its oscillation, and the external terminals 31 and 32 connected to the stopped oscillator 42 attain the state performing no function. FIG. 3 is a timing chart showing various signals.

If the external terminal (e.g., terminal 32 as described above) in the state performing no function is to be used for input/output of a signal, such a structure may be used that a transfer gate TF is interposed between the NAND gate 35 and the one external terminal 32 as represented by broken line, and a circuit which connects the transfer gate to the one external terminal 32 is connected to the input of the input buffer 3 and the output of the output buffer 4 as represented by broken line. According to this structure, the oscillation is enabled when the transfer gate TF is turned on. Also, when the transfer gate TF is turned off, the loop of the oscillator circuit is disconnected, and the input buffer 3 or the output buffer 4 can input or output the signal, so that the external terminal 32 can be used as the input/output terminal. However, the resistance Rt of transistor of the transfer gate can be substantially expressed by the following formula:

$$R_t = 1/(\beta(V_{GS} - V_{th} - V_{DS})) \quad (1)$$

$$\beta = (\mu \epsilon / t_{ox})(W/L) \quad (2)$$

where (at unsaturated region)

μ: effective surface mobility of electrons at channel

β: gain coefficient of MOS transistor

ε: dielectric constant of gate insulator $V_{GS}$: voltage across gate and source $V_{th}$: threshold voltage $V_{DS}$: voltage across drain and source $t_{ox}$: thickness of gate insulator W: channel width L: channel length As can be seen from the above formulas (1),(2), the resistance Rt of transistor of the transfer gate increases in accordance with decrease of the power supply voltage, and forms a large load against the drive capability of the oscillator circuit, which narrows a low voltage region, i.e., a region allowing the oscillation. Therefore, if the transistor having the conventional transistor characteristics is used at the transfer gate, it may be impossible to ensure turn-on at the start of the oscillation because the on-resistance of the transfer gate is high.

Thus, when the function-switching control signal 90 attains the H-level as shown in FIG. 3, the transfer gate TF is turned on. However, the on-resistance of the transfer gate TF does not, decrease as described before. Therefore, the oscillation may not be performed, in which case the oscillation voltage is not applied to the output terminal 91 of the NAND circuit 35 and the external terminal 32 as shown in FIG. 3. Thereafter, when the function-switching control signal 90 attains the L-level as shown in FIG. 3, the transfer gate TF is turned off. When the output control signal 10 attains the H-level as shown in FIG. 3, the signal 92 is sent to the external terminal 32 via the output buffer 4. Although the state can be surely switched from the oscillating state to the signal input/output state, the state may not be surely switched from the signal input/output state to the oscillating state.

SUMMARY OF THE INVENTION

The invention has been developed to overcome the above problems, and it is an object of the invention to provide a semiconductor integrated circuit, in which a transfer gate can be surely turned on to supply a signal of an oscillator from an amplifier circuit having a low voltage for ensuring switching from a signal input/output state to an oscillating state, so that a terminal to be connected to the oscillator can be used also as a terminal for inputting and outputting the signal.

A semiconductor integrated circuit according to the invention includes a switching element which is interposed between an amplifier circuit in an oscillator circuit and one of terminals to be connected to an oscillator and which includes a transistor having such characteristics that a resistance increases in accordance with decrease of a power supply voltage, and an input buffer and/or an output buffer connected to a circuit which connects an output of the switching element to one of said terminals. The threshold voltage of the transistor of said switching element is lower than a threshold voltage of any other transistor except for that of said switching element.

Further, in the semiconductor integrated circuit according to the invention, said switching element is a transfer gate, and a back-gate voltage of the transistor of said transfer gate is controlled to reduce the threshold voltage.

Accordingly, the resistance of the transistor of said transfer gate is smaller than resistance of any other transistor, resulting in reduction of an operation voltage. Upon start of the operation of said amplifier circuit, said transfer gate is turned on with a low voltage and surely starts the oscillation. Upon stop of the operation of said amplifier circuit, said transfer gate is turned off to stop the oscillation, and the oscillator circuit is disconnected, so that the input buffer and/or output buffer can perform input and/or output of the signal via said terminals. These terminals can be used for connection to the oscillator as well as for input/output of the signal.

The above and further objects and features of the invention will more fully be apparent from the following detailed description with accompanying drawings.

DESCRIPTION OF THE PREFERRED EMBODIMENTS

Figure 1:
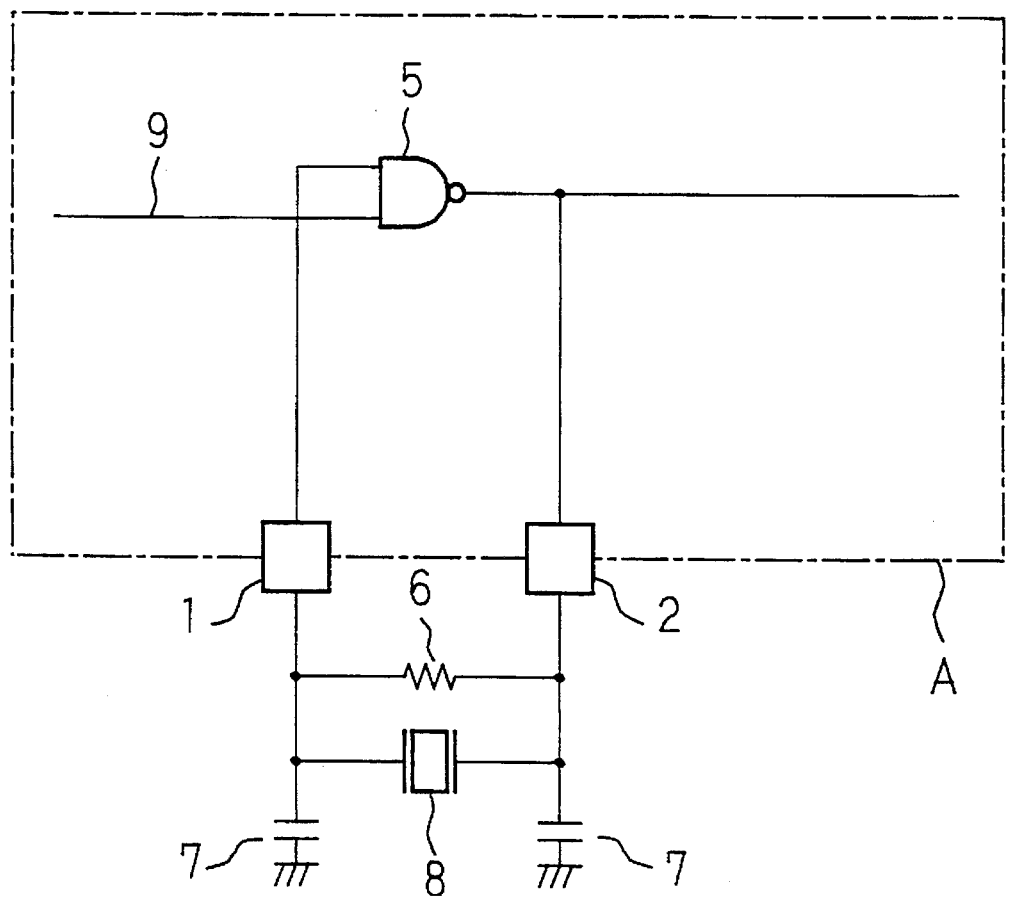
FIG. 1 is a circuit diagram showing a structure of a semiconductor integrated circuit in the prior art.
Figure 2:
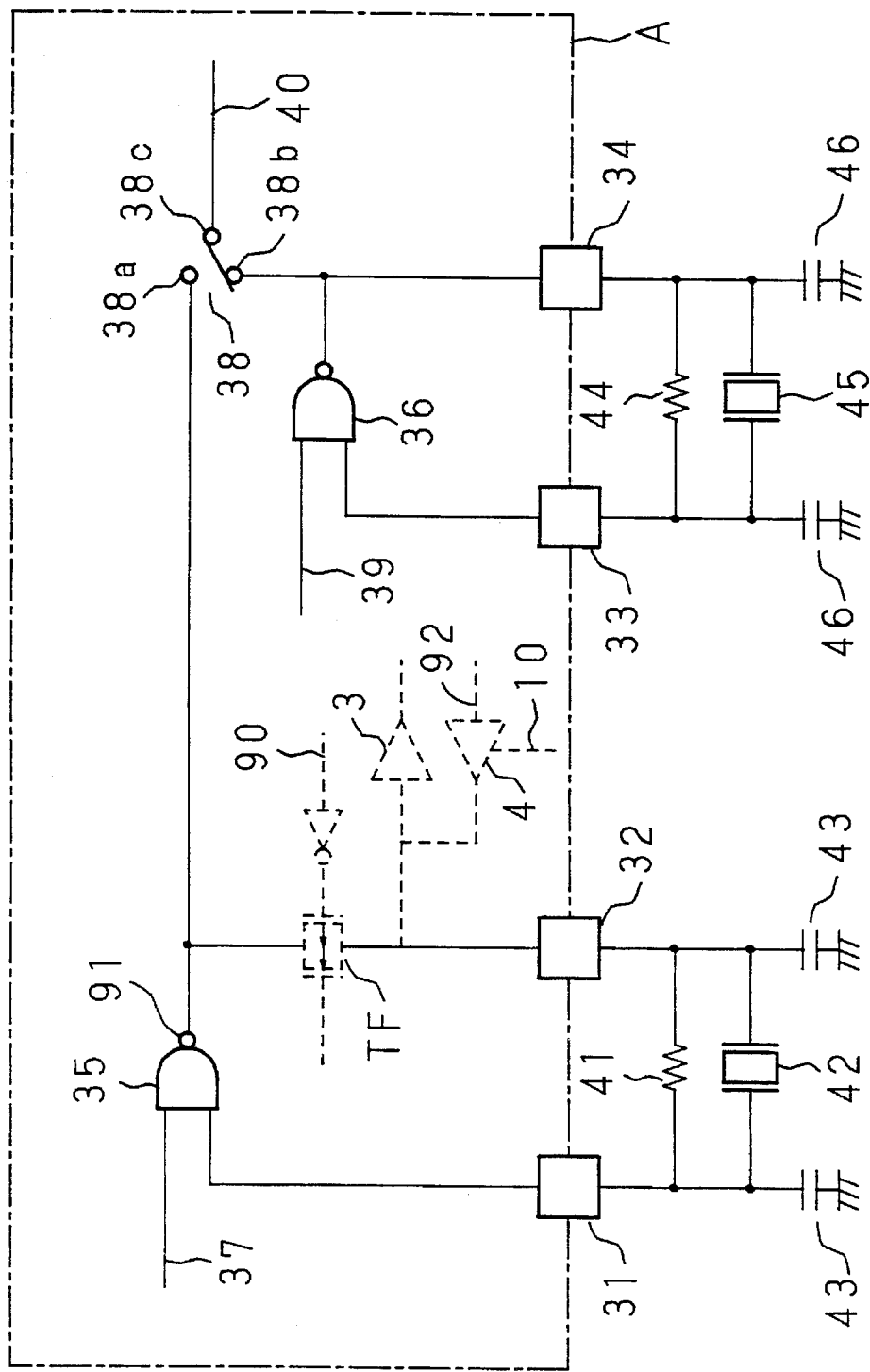
FIG. 2 is a circuit diagram showing a structure of other semiconductor integrated circuit in the prior art.
Figure 3:
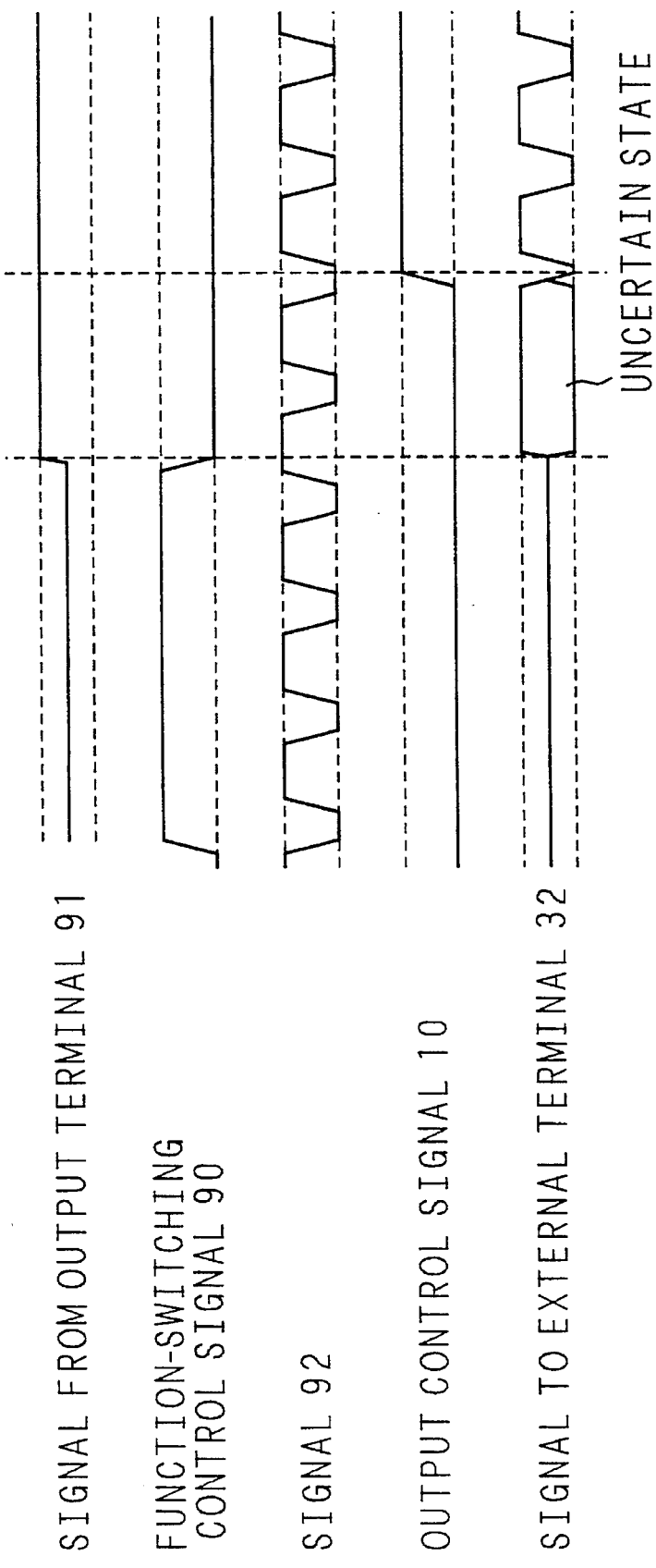
FIG. 3 is a timing chart showing various signals in another semiconductor integrated circuit in the prior art.
Figure 4:
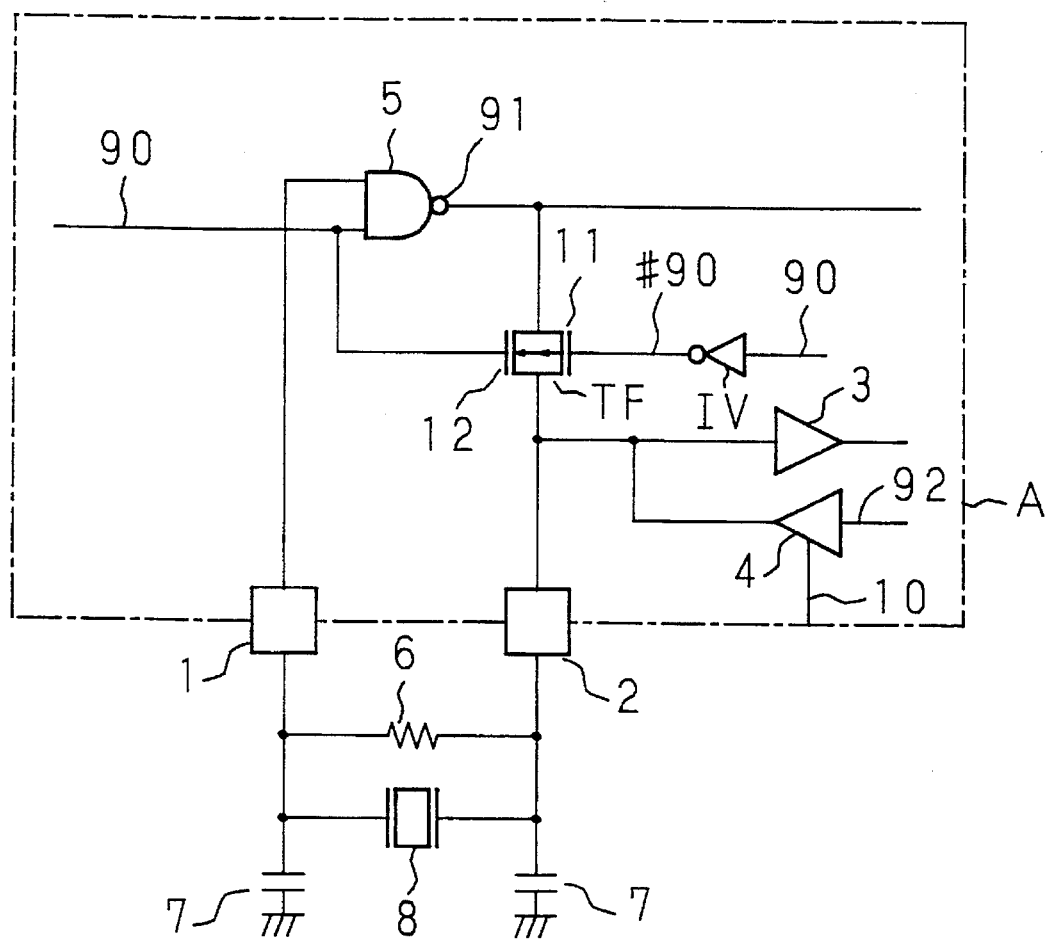
FIG. 4 is a circuit diagram showing a structure of a semiconductor integrated circuit according to the invention.

The present invention will now be described below with reference to the drawings showing embodiment thereof. FIG. 4 is a circuit diagram showing a structure of a semiconductor integrated circuit according to the invention. A chip A containing a semiconductor integrated circuit is provided with external terminals 1 and 2. The chip A contains an NAND circuit 5, i.e., an inverting amplifier circuit which is formed of a CMOS transistor using as its power supply an output of a voltage reducing regulator reducing a voltage. The chip A also contains a transfer gate TF formed of a P-channel MOS transistor (hereinafter referred to as "P-channel transistor") 11 and an N-channel MOS transistor (hereinafter referred to as "N-channel transistor") 12 as well as an input buffer 3 and an output buffer 4. The threshold voltage of the P-channel transistor 11 of the transfer gate TF is set to a value not exceeding 0.7 V which is lower than the threshold voltage of 0.8 V–0.7 V of other transistors contained in the semiconductor integrated circuit.

The external terminal 1 is connected to an input terminal at one side of the NAND circuit 5, of which output terminal 91 is connected to the external terminal 2 via the transfer gate TF. The output terminal 91 of the NAND circuit 5 is also connected to an unillustrated circuit to which a clock is supplied. The NAND circuit 5 receives on its input terminal at the other side a function-switching control signal 90 for switching the function of the external terminals 1 and 2. The function-switching control signal 90 is applied to a gate of the N-channel transistor 12 of the transfer gate TF and an inverter IV. An inverted function-switching control signal #90 output from the inverter IV is supplied to a gate of the P-channel transistor 11 of the transfer gate TF.

A circuit connecting the transfer gate TF to the external terminal 2 is connected to an input of the input buffer 3 and an output of the output buffer 4. The output buffer 4 receives a signal 92 to be outputted from the chip A, and also receives on its control terminal an output control signal 10. Externally to the chip A, there is provided a parallel circuit including a damping resistance 6 and an oscillator 8 interposed between the external terminals 1 and 2. The external terminals 1 and 2 are grounded via load capacitances 7. In this manner, the oscillator circuit of a low power consumption is formed of the NAND circuit 5, transfer gate TF, damping resistance 6, load capacitances 7 and oscillator 8.

Figure 5:
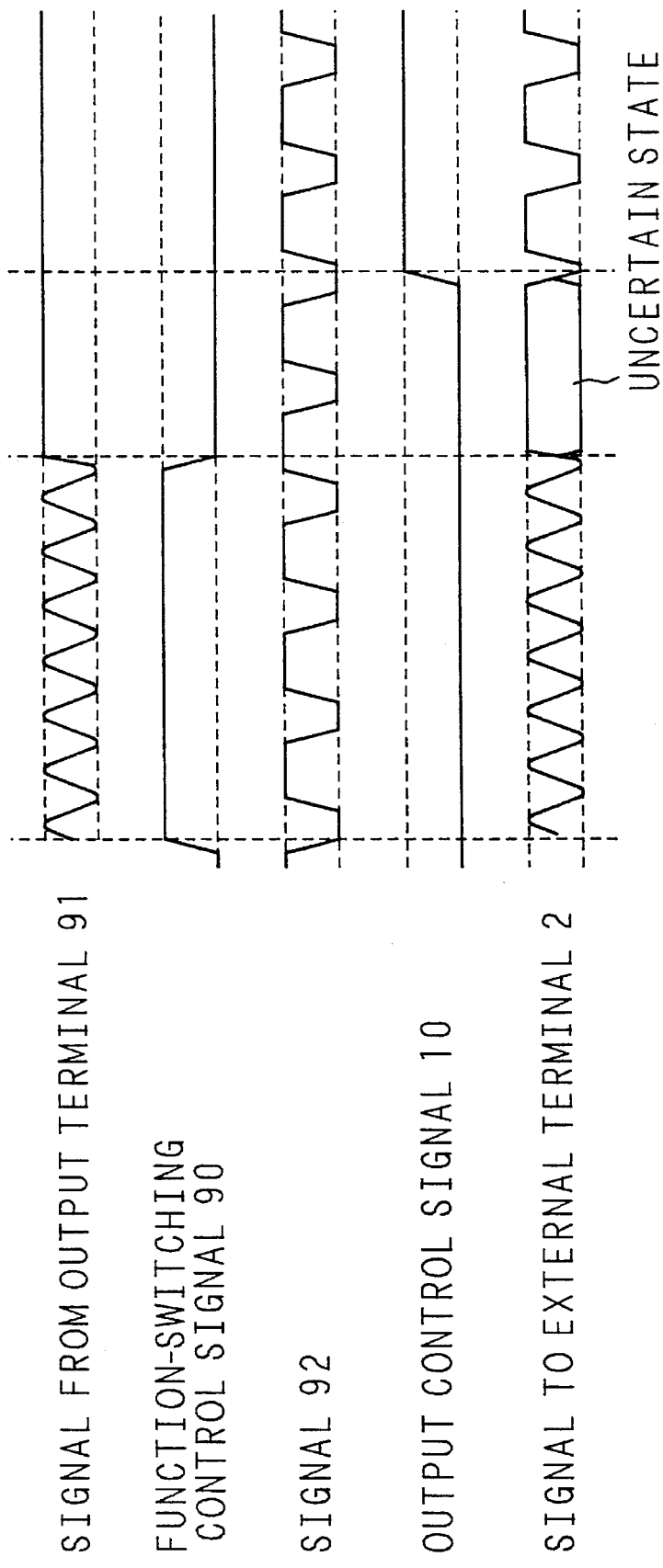
FIG. 5 is a timing chart showing various signals in the semiconductor integrated circuit according to the invention.

Operation of the semiconductor integrated circuit thus constructed will be described below with reference to FIG. 5 which is a timing chart showing various signals. As shown in FIG. 5, when the function-switching control signal 90 is at the H-level, the NAND circuit 5 operates as an inverting amplifier to apply its output voltage to a source side of the transfer gate TF. The threshold voltage $V_{th}$ of the P-channel transistor 11 of the transfer gate TF is set to a value not exceeding 0.7 V which is lower than the threshold voltage of the other conventional transistors contained in the semiconductor integrated circuit. Therefore, the resistance $R_t$ of the transfer gate TF formed of the P-channel transistor 11 and the N-channel transistor 12 is lower than the resistances of the other transistors. Thus, a low voltage region of the operation voltage enabling the oscillation is widened. Therefore, the low voltage applied from the NAND circuit 5 at the start of the operation turns on the transfer gate TF owing to a low resistance, and thus the oscillator circuit surely starts the oscillation. Thereby, the output terminal 91 of the NAND circuit 5 supplies the oscillation voltage shown in FIG. 5, and the oscillation voltage shown in FIG. 5 is applied also to the external terminal 2. Thus, the external terminals 1 and 2 function also as the connection terminal of the oscillator 8.

When the function-switching control signal 90 attains the L-level, the output terminal 91 of the NAND circuit 5 attains the H-level as shown in FIG. 5 regardless of the input from the external terminal 1, so that the inverting and amplifying operation by the NAND circuit 5 and hence the oscillation stop, and the transfer gate TF is turned off to disconnect the NAND circuit 5 from the external terminal 2. The external terminal 2 attains the undefined state. Therefore, when a signal is externally applied to the external terminal 2, the signal can be supplied to a predetermined circuit via the input buffer 3. On the other hand, when the output control signal 10 at the H-level is applied to the control terminal of the output buffer 4 as shown in FIG. 5, the internal signal 92 shown in FIG. 5 is supplied to the external terminal 2 via the output buffer 4.

The external terminals 1 and 2 function as the input/output terminals for the signal. When the function-switching signal 90 is set to the H-level again, the NAND circuit 5 starts the inverting and amplifying operation, and the transfer gate TF is turned on, so that the oscillation is surely started as already described. This ensures the start of the oscillation, and allows the external terminals to be used for connection to the oscillator as well as for input/output of the signal.

In this embodiment, the threshold voltage of the P-channel transistor 11 of the transfer gate TF is set to a value not exceeding 0.7 V which is lower than the threshold voltage of the conventional transistors contained in the semiconductor integrated circuit. The threshold voltage of the N-channel transistor 12 of the transfer gate TF may be similarly set to a value not exceeding 0.7 V, in which case a similar effect can be achieved. Both the threshold voltages of the P-channel and N-channel transistors 11 and 12 of the transfer gate TF may be similarly set to a value not exceeding 0.7 V, in which case the resistance of the transfer gate can be further reduced, and thus the low voltage range of the start voltage for the oscillation can be widened, so that switching from the signal input/output state to the oscillating state can be performed more surely. The lower limit of the threshold voltage is the minimum value which enables the turn-on and turn-off of the transfer gate TF.

The threshold voltage of the P-channel transistor 11 or the N-channel transistor 12 of the transfer gate TF can be ostensibly set to a value not exceeding 0.7 V by controlling the voltage of the back-gate, in which case a similar effect can also be achieved. Further, each threshold voltage of the P-channel transistor 11 and the N-channel transistor 12 can be ostensibly set to a value not exceeding 0.7 V by controlling the voltage of the back-gate, in which case a similar effect can also be achieved. Although the embodiment described above uses the NAND circuit as the inverting and amplifying circuit, the invention is not restricted to this.

According to the invention, as described hereinbefore, since the threshold voltage of the transistor of the transfer gate for turning on and off the oscillator circuit is set to a value lower than the threshold voltage of any other transistor, so that the resistance of the transfer gate can be smaller than the resistance of the conventional transistors, which widens the low voltage region of the operation voltage enabling the oscillation when turning on the transfer gate. According to the present invention, therefore, the transfer gate can be surely turned on when the voltage is low immediately after the start of oscillation, and hence the state can be surely switched from the signal input/output state to the oscillating state.

By turning off the transfer gate, the inverting and amplifying circuit can be disconnected from one of the terminals, so that the signal can be inputted/outputted via the disconnected terminal. Therefore, the invention can provide significant advantages, for example, that the terminal can be used for connection to the oscillator as well as for input/output of the signal.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such mates and bounds thereof are therefore intended to be embraced by the claims.

What is claimed is:

1. A semiconductor integrated circuit with an oscillator connected between two terminals, comprising:
    an amplifier circuit interposed between said two terminals for amplifying a signal supplied from said oscillator;
    a switching element interposed between said amplifier circuit and one of said two terminals and including transistors having a resistance which increases as a power supply voltage decreases; and
    at least one of an input buffer and an output buffer connected to said switching element and to said one of said terminals which is connected to an external circuit,
    wherein at least one of said transistors of said switching element has a threshold voltage lower than the threshold voltage of any other transistor used in said semiconductor integrated circuit except for those used in said switching element.

2. A semiconductor integrated circuit according to claim 1, wherein said switching element is a transfer gate.

3. A semiconductor integrated circuit according to claim 2, wherein the threshold voltage of said transfer gate is set by controlling a back-gate voltage of at least one of said transistors included in said transfer gate.

\* \* \* \* \*